(12) United States Patent
Zhou et al.

(10) Patent No.: US 12,147,689 B2
(45) Date of Patent: *Nov. 19, 2024

(54) TEMPERATURE-BASED MEDIA MANAGEMENT FOR MEMORY COMPONENTS

(71) Applicant: Micron Technology, Inc., Boise, ID (US)

(72) Inventors: Zhenming Zhou, San Jose, CA (US); Ying Yu Tai, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/229,795

(22) Filed: Aug. 3, 2023

(65) Prior Publication Data

US 2023/0400993 A1 Dec. 14, 2023

Related U.S. Application Data

(63) Continuation of application No. 17/739,794, filed on May 9, 2022.

(51) Int. Cl.
*G06F 3/00* (2006.01)
*G06F 1/20* (2006.01)
*G06F 3/06* (2006.01)

(52) U.S. Cl.
CPC ............ *G06F 3/0629* (2013.01); *G06F 1/206* (2013.01); *G06F 3/061* (2013.01); *G06F 3/0673* (2013.01)

(58) Field of Classification Search
None
See application file for complete search history.

(56) References Cited

U.S. PATENT DOCUMENTS 11,768,615 B1 * 9/2023 Zhou ..................... G06F 3/0683
711/170
2020/0333976 A1 10/2020 Cariello

* cited by examiner

*Primary Examiner* — Midys Rojas
(74) *Attorney, Agent, or Firm* — Schwegman Lundberg & Woessner, P.A.

(57) ABSTRACT

Aspects of the present disclosure configure a system component, such as a memory sub-system controller, to provide adaptive media management based on temperature-related memory component capabilities. The controller can obtain a write temperature associated with an individual group of memory components. Based on the write temperature and a temperature threshold associated with the individual group of memory components, the controller can select an individual media management operation to perform.

20 Claims, 5 Drawing Sheets

TEMPERATURE-BASED MEDIA MANAGEMENT FOR MEMORY COMPONENTS

PRIORITY APPLICATION

This application is a continuation of U.S. application Ser. No. 17/739,794, filed May 9, 2022, which is incorporated herein by reference in its entirety.

TECHNICAL FIELD

Embodiments of the disclosure relate generally to memory sub-systems and, more specifically, to providing temperature-based media management for memory components, such as memory dies.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
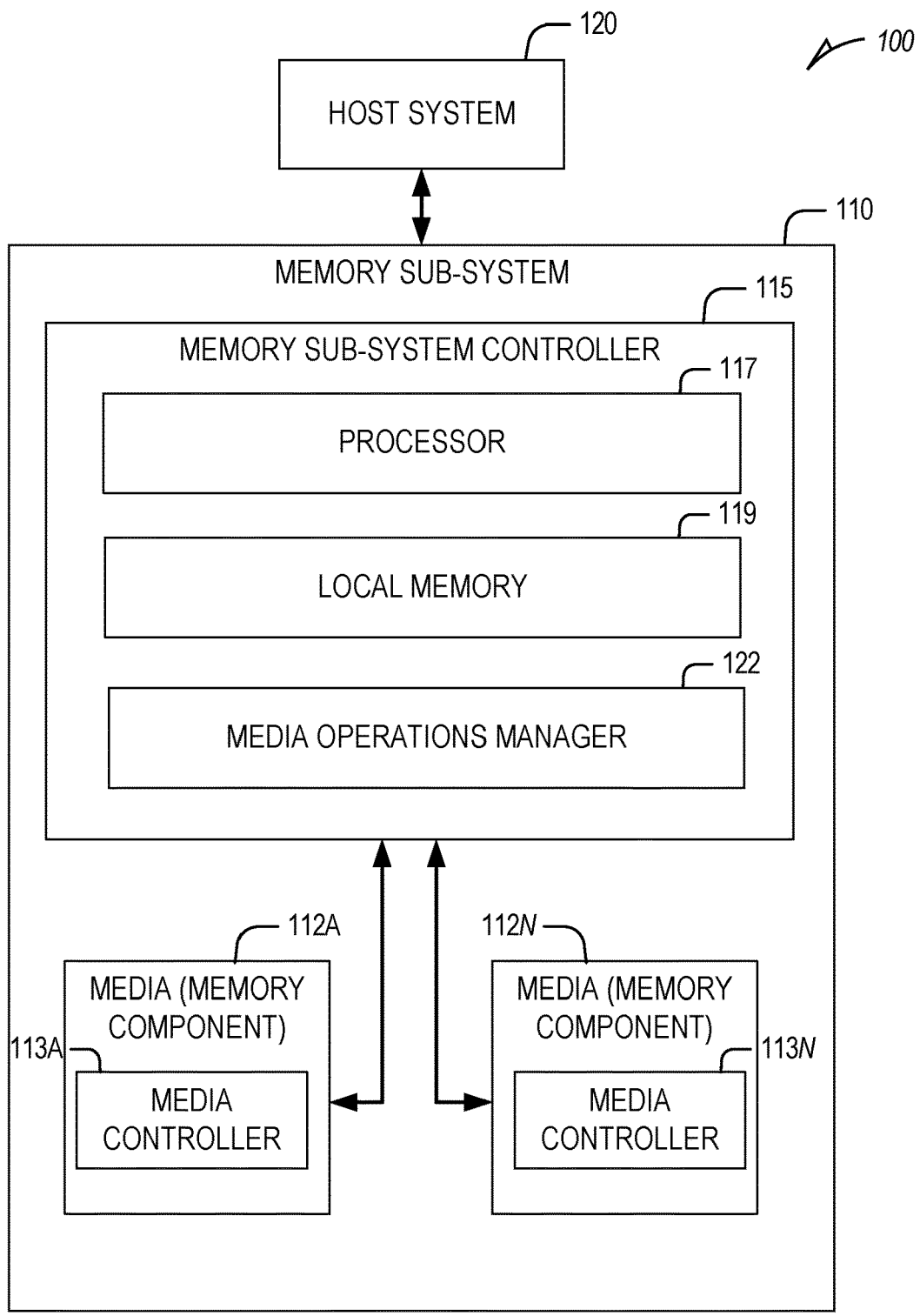
FIG. 1 is a block diagram illustrating an example computing environment including a memory sub-system, in accordance with some embodiments of the present disclosure.

Aspects of the present disclosure configure a system component, such as a memory sub-system controller, to perform different memory management operations on different groups of memory components (e.g., memory dies) based on their respective temperature thresholds associated with their respective reliability grades (or measures). The memory sub-system controller can access configuration data associated with a set of memory components. The configuration data can include a table that associates different groups of memory components with respective temperature thresholds representing or describing a cross temperature range of the group of memory components. The cross temperature range can indicate a low temperature value and a high temperature value that can be used to compare against a write temperature of a respective memory component. The cross temperature can also or in the alternative indicate a maximum temperature drift between write temperatures of different word lines of the memory components. Based on configuration data (which can be stored on the memory components and/or a memory of the controller), the controller can dynamically select an individual media management operation from a plurality of media management operations to perform on the individual group of memory components. This enables the controller to dynamically select and tailor different media management operations to the temperature threshold of the corresponding group of memory components, which improves the overall efficiency of operating the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data". Together with the data written to each memory component or group of memory components, the memory sub-system or host can measure and store the current write temperature. In some examples, different memory components can store data that is associated with different write temperatures as temperature naturally drifts as data is written.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data". "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation.

If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

There are challenges in efficiently managing or performing media management operations on typical memory devices. Specifically, certain memory devices, such as NAND flash devices, include large die-by-die reliability (RWB) variation and temperature dependence. For example, certain die can be capable of withstanding (to avoid data loss) particular cross temperatures or temperature ranges while other dies can handle wider temperature ranges. As the technology for such memory devices continues to be scaled down, this die-by-die reliability variation and cross temperature ranges becomes more pronounced and problematic in performing memory management. Current memory systems (e.g., SSD drive or die package systems) associate all of the memory devices in the memory system with a certain reliability specification and temperature ranges or thresholds. The memory systems need to meet the reliability specification to be approved for use and cannot include any particular memory device that fails to meet the reliability specification.

Typical memory systems include many memory components or memory dies on the order of 8, 16, 32, 64, and so forth memory dies. Some of the memory dies can be associated with reliability grades and can avoid data loss under temperature ranges (e.g., write temperature variations) that far exceed the reliability specification while other memory dies have reliability grades that are close to the reliability specification. Current memory controllers perform memory management operations on such memory systems on the basis of the reliability specification rather than the actual reliability grades of the individual memory dies. As a result, an unnecessary amount of memory management operations can end up being performed on memory dies that have a very high reliability grade, which can adversely impact the overall performance of the memory system. For example, typical memory controllers can perform the same scan frequency or rate across all of the memory dies based on the worst case reliability grade of the memory system. While such a scan rate is suitable for memory dies with relatively low reliability grades, this scan rate may not be necessary for memory dies with higher reliability grades (e.g., those that can successfully tolerate wider temperature ranges) and can result in performance of media scans that are not needed. This waste in media scans reduces the efficiency, speed and performance of the memory systems. Current memory systems fail to provide a solution that addresses the needs of all memory devices and applications based on their respective reliability grades or measures and/or temperature ranges or temperature range/drift tolerance.

Aspects of the present disclosure address the above and other deficiencies by providing a memory controller that can receive configuration data that associates different memory components with their respective temperature thresholds and can use that configuration data to selectively perform memory management operations on the respective memory components. For example, the memory controller can perform a first set of memory management operations (e.g., a first scan rate or scan frequency) for a first set of memory components associated with a first temperature threshold while performing a second set of memory management operations (e.g., a second scan rate or scan frequency) for a second set of memory components associated with a second temperature threshold. In this way, the memory controller can perform the first set of memory management operations when a write temperature falls outside of an associated temperature threshold while performing the second set of memory management operations when the write temperature is within the tolerable associated temperature threshold. As a result, the memory controller can tailor the memory management operations to their particular reliability grades and temperature dependent parameter of the memory components without having to sacrifice performance by applying the same memory management operations across all of the memory components. This increases the efficiency of operating memory systems.

For some embodiments, the memory sub-system (e.g., memory sub-system controller) can access configuration data associated with the set of memory components. The memory sub-system can determine, based on the configuration data, one or more temperature thresholds associated with different groups of memory components of the set of memory components. The memory sub-system can obtain a write temperature associated with an individual group of memory components of the set of memory components. Thereafter, the memory sub-system performs an individual media management operation on the individual group of memory components based on the write temperature and a temperature threshold associated with the individual group of memory components. For example, the memory sub-system can select the individual media management operation from a plurality of media management operations based on the write temperature and the temperature threshold.

In some examples, the temperature thresholds of each memory component are determined when the memory components are manufactured and packaged. The temperature thresholds are then stored in configuration data associated with the packaged memory components. In some examples, the temperature thresholds are determined, updated and/or predicted by the memory sub-system after the memory components are installed and in use. In some examples, the configuration data can be received by the controller from the firmware controller, a host system, or the memory components. The one or more temperature thresholds can correspond to a cross temperature reliability measure defined by a difference between read and write temperatures of different groups of memory components of the set of memory components.

In some examples, the memory sub-system can store a table that associates the individual group of memory components with a first temperature threshold and associates another group of memory components with a second temperature threshold. This data can also be stored as part of the configuration data of the memory system. The memory sub-system can determine, based on the configuration data, that an individual group of memory components is associated with the first temperature threshold and can perform an individual media management operation based on comparison of the current write temperature to the first temperature threshold. For example, the memory sub-system can select to perform a first media scan rate on the individual group of memory components.

In some examples, multiple media management operations can be available, such as different media scan rates. The memory sub-system can select one of the media scan rates to perform by reading a write temperature associated with an individual memory component and comparing that write temperature to the temperature threshold associated with the individual memory component. As referred to herein, the phrase "write temperature" represents a temperature value that was measured when data was written to the memory component and written together and in association with the data. This write temperature can be read at a later instance or time (e.g., seconds, minutes, hours or days later) to compare against a tolerable temperature threshold and to selectively and dynamically tailor a particular media management operation to perform to maintain data integrity of the stored data. For example, the memory sub-system can compute a deviation between the write temperature and the temperature threshold associated with the individual memory component. If the write temperature transgresses or falls outside of a temperature range represented by the temperature threshold (e.g., the write temperature is above a maximum temperature value or is below a minimum temperature value), the memory sub-system performs a first media scan rate. However, if the write temperature fails to transgress or falls within of the temperature range represented by the temperature threshold, the memory sub-system performs a second media scan rate that may be of a lower value than the first media scan rate.

As another example, if the write temperature drifts across a number of word lines or blocks (e.g., an absolute value of a difference between the write temperature of a first word line or block and the write temperature of a second word line or block) by more than the temperature threshold, a first media management operation, such as the first media scan rate or a folding operation that refreshes data can be performed. Namely, the memory sub-system can access a first temperature value associated with a first word line of the individual group of memory components and can access a second temperature value associated with a second word line of the individual group of memory components. The memory sub-system can compute a difference between the first and second temperature values, such as the absolute difference between the first and second temperature values. The memory sub-system can compare the difference to the temperature threshold and perform the individual media management operation (e.g., the first media scan rate or folding operation) in response to determining that the difference is greater than the temperature threshold. If the write temperature drifts across the number of word lines or blocks (e.g., an absolute value of a difference between the write temperature of a first word line or block and the write temperature of a second word line or block) by less than the temperature threshold, a second media management operation, such as the second media scan rate, can be performed that can be of a greater or smaller value than the first media scan rate. In some cases, if the write temperature drifts across the number of word lines or blocks by less than the temperature threshold, a media management operation can be skipped, omitted, or prevented from being performed, such as to avoid performing a folding operation.

In this way, different memory management operations can be performed on different groups, bins, or sets of memory components based on their respective reliability grades and/or temperature thresholds or temperature tolerances. In such cases, the memory sub-system can apply different media scan frequency to different dies based on the die's temperature tolerance or threshold. As such, the dies with relatively poor or low temperature tolerance can be scanned more frequently to avoid read failure, while the dies with relatively better or higher temperature tolerance can be scanned less frequently to maintain the same system performance and data integrity.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies).

In some examples, the first memory component 112A or group of memory components including the first memory component 112A can be associated with a first temperature threshold (or tolerance) and/or reliability (capability) grade, value or measure. The terms "reliability grade," "reliability value" or "reliability measure" are used interchangeably throughout and can have the same meaning. Temperature threshold and temperature tolerance measure is used interchangeably throughout and can have the same meaning. The second memory component 112N or group of memory components including the second memory component 112N can be associated with a second temperature threshold and/or reliability (capability) grade, value or measure. In some examples, each memory component 112A to 112N can store respective configuration data that specifies the respective temperature threshold. In some examples, a memory or register can be associated with all of the memory components 112A to 112N that can store a table that maps different groups, bins or sets of the memory components 112A to 112N to respective temperature thresholds. In some examples, each of the memory components 112A to 112N can store a write temperature that has been measured when data was written to the respective memory component 112A to 112N. This data can be stored in a separate write temperature register of each memory component 112A to 112N and/or as part of the underlying data stored to the respective memory component 112A to 112N.

In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages, word lines or blocks that can refer to a unit of the memory component 112 used to store data. In some examples, the memory cells of the memory components 112A to 112N can be grouped into a set of different zones of equal or unequal size used to store data for corresponding applications. In such cases, each application can store data in an associated zone of the set of different zones. In some examples, different memory cells within each memory component 112A to 112N can be associated with different temperature thresholds. In some examples, different memory cells within each memory component 112A to 112N can be associated with write temperatures. In such cases, different memory management operations can be performed on different groups of memory cells within each memory component 112A to 112N based on deviations between the write temperatures and the corresponding temperature thresholds associated with the respective memory component 112A to 112N.

The memory sub-system controller 115 can communicate with the memory components 112A to 112N to perform operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, folding operations, preventing folding operations from being performed, and/or different dynamic data refresh operations.

The memory sub-system controller 115 can include hardware such as one or more integrated circuits and/or discrete components, one or more thermometers (used to measure a current operating temperature of the memory sub-system 110 and/or the memory components 112A to 112N or ambient temperature), a buffer memory, and/or a combination thereof. In some examples, the output of the one or more thermometers can be used to determine a current write temperature to be stored in association with data on the memory components 112A to 112N.

The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112N to 112N. The configuration data can describe the temperature thresholds and/or reliability grades associated with different groups of the memory components 112N to 112N.

The memory sub-system controller 115 can be responsible for other memory management operations, such as wear leveling operations, garbage collection operations, error detection and error-correcting code (ECC) operations, encryption operations, caching operations, media scans, data refreshing, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a media operations manager 122. The media operations manager 122 can be configured to selectively and adaptively perform different memory management operations on the memory components 112A to 112N on the basis of a write temperature and temperature threshold associated with the respective memory components 112A to 112N. For example, the media operations manager 122 can access configuration data associated with the set of memory components 112A to 112N. The media operations manager 122 can determine, based on the configuration data, one or more temperature thresholds associated with different groups of memory components of the set of memory components 112A to 112N.

The media operations manager 122 can obtain a write temperature associated with an individual group of memory components of the set of memory components 112A to 112N. Thereafter, the media operations manager 122 can selectively perform an individual media management operation (e.g., a media scan with a particular frequency and/or folding operation) on the individual group of memory components 112A to 112N based on the write temperature and a temperature threshold associated with the individual group of memory components 112A to 112N.

As an example, the media operations manager 122 can determine that the first memory component 112A is associated with a first temperature threshold based on the configuration data. The media operations manager 122 can access write temperature data that specifies the write temperature of the data stored to a block, page, or word line of the first memory component 112A. The media operations manager 122 can compare the write temperature to the first temperature threshold. For example, the media operations manager 122 can determine whether the write temperature is above a maximum temperature threshold or is below a minimum temperature threshold. In response to determining that the write temperature fails to transgress the first temperature threshold (e.g., if the write temperature is within the range defined by the minimum and maximum temperature thresholds), the media operations manager 122 can perform or apply a first scan rate or frequency to the data stored in the first memory component 112A. In response to determining that the write temperature transgresses the first temperature threshold (e.g., if the write temperature is outside the range defined by the minimum and maximum temperature thresholds), media operations manager 122 can perform or apply a second scan rate or frequency to the data stored in the first memory component 112A.

As another example, the media operations manager 122 can determine that the second memory component 112N is associated with a second temperature threshold based on the configuration data. The media operations manager 122 can access write temperature data that specifies the write temperature of the data stored to a block, page, or word line of the second memory component 112N. The media operations manager 122 can compare the write temperature to the second temperature threshold. In some cases, the write temperature of the data stored in the second memory component 112N can be the same as the write temperature of the data stored in the first memory component 112A. However, because the temperature thresholds differ between the first and second memory components 112A and 112N, the media operations manager 122 performs different media management operations. For example, the media operations manager 122 can determine whether the write temperature is above a maximum temperature threshold or is below a minimum temperature threshold of the second memory component 112N. In response to determining that the write temperature fails to transgress the second temperature threshold, the media operations manager 122 can perform or apply a third scan rate or frequency to the data stored in the second memory component 112N. In response to determining that the write temperature transgresses the second temperature threshold (e.g., if the write temperature is outside the range defined by the minimum and maximum temperature thresholds), media operations manager 122 can perform or apply a fourth scan rate or frequency to the data stored in the second memory component 112N. The first, second, third and fourth scan rates can all be different values.

As another example, the media operations manager 122 can perform different media management operations based on measuring a write temperature drift across data written to two separate blocks, pages and/or word lines of a particular memory components 112A to 112N. Namely, the media operations manager 122 can access a first temperature value associated with a first word line of the first memory component 112A and can access a second temperature value associated with a second word line of the first memory component 112A. The second word line can correspond to a last written word line of a page of data. The media operations manager 122 can compute a difference between the first and second temperature values, such as the absolute difference between the first and second temperature values. The media operations manager 122 can compare the difference to an individual temperature threshold associated with the first memory component 112A and can perform an individual media management operation (e.g., the first media scan rate or folding operation) in response to determining that the difference is greater than the temperature threshold. The media operations manager 122 can determine that the write temperature drifts across the number of word lines or blocks (e.g., an absolute value of a difference between the write temperature of a first word line or block and the write temperature of a second word line or block) by less than the individual temperature threshold. In such cases, the media operations manager 122 can perform a second media management operation, such as the second media scan rate that can be of a greater or smaller value than the first media scan rate or can avoid performing any media management operation at all (e.g., the media operations manager 122 can avoid performing a folding operation).

In some examples, an individual group of memory components 112A to 112N can be associated with two different thresholds. A first threshold can be used to select a parameter of a first type of media management operations to perform and a second threshold can be used to determine whether or not to perform a second type of media management operation. Namely, the first threshold can define a range of temperatures, such that a write temperature that falls outside of the range causes a media scan or frequency to be performed with a first relatively high value whereas a write temperature that falls within of the range causes the media scan or frequency to be performed with a second relatively low value. The second threshold can be used to compare against a difference or absolute difference between two write temperatures of two or more word lines, blocks or pages of data stored to the memory components 112A to 112N. Based on such a difference, the media operations manager 122 can perform or fail to perform a folding operation to refresh data stored in the memory components 112A to 112N.

Depending on the embodiment, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
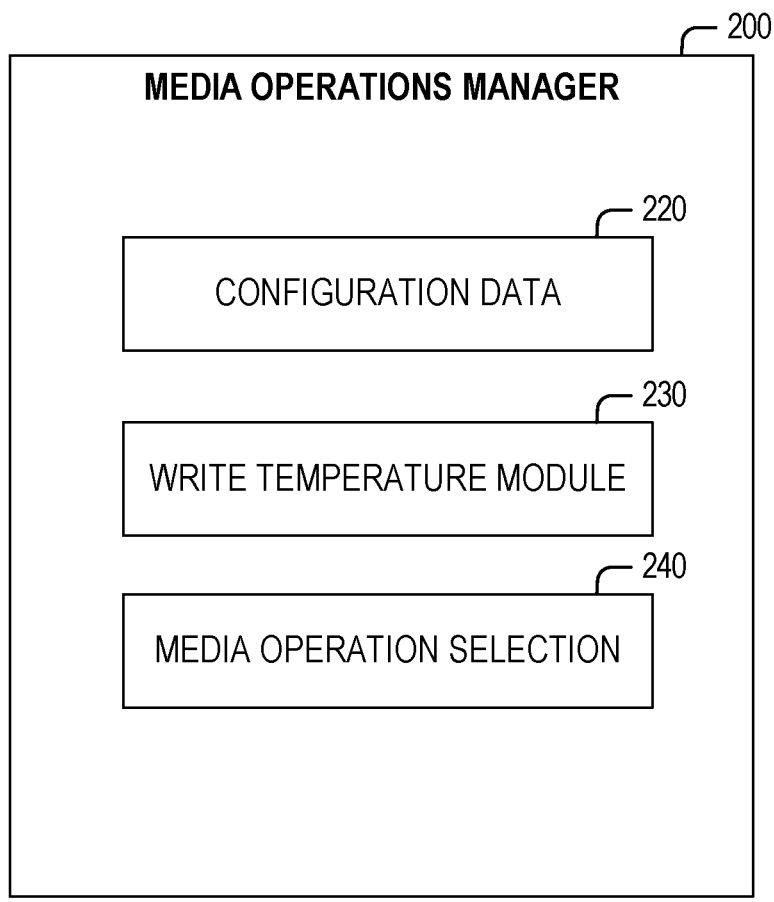
FIG. 2 is a block diagram of an example media operations manager, in accordance with some implementations of the present disclosure.

FIG. 2 is a block diagram of an example media operations manager 200 (e.g., media operations manager 122), in accordance with some implementations of the present disclosure. As illustrated, the media operations manager 200 includes configuration data 220, a write temperature module 230, and a media operation selection 240. For some embodiments, the media operations manager 200 can differ in components or arrangement (e.g., fewer or more components) from what is illustrated in FIG. 2.

The configuration data 220 accesses and/or stores configuration data associated with the memory components 112A to 112N. In some examples, the configuration data 220 is programmed into the media operations manager 122. For example, the media operations manager 122 can communicate with the memory components 112A to 112N to obtain the configuration data and store the configuration data 220 locally on the media operations manager 122. In some examples, the media operations manager 122 communicates with the host system 120. The host system 120 receives input from an operator or user that specifies parameters including temperature tolerances or thresholds of different bins, groups or sets of the memory components 112A to 112N. The media operations manager 122 receives the configuration data from the host system 120 and stores the configuration data in the configuration data 220.

In some examples, the media operations manager 122 performs one or more test operations on different groups of the memory components 112A to 112N. In some examples, the configuration data 220 is updated during runtime based on write temperature fluctuations using the test operations. The test operations are configured to determine or predict temperature tolerance of each of the memory components 112A to 112N. Based on a result of the test operations, the media operations manager 122 can store or update the temperature threshold stored in the configuration data 220 for the different groups of memory components 112A to 112N. In some examples, the media operations manager 122 can periodically or routinely perform the test operations. The media operations manager 122 can determine that an individual memory component 112A is associated with a first temperature threshold based on the configuration data 220. The media operations manager 122 can perform a set of test operations on the individual memory component 112A and can determine, based on a result of the test operations, that the temperature threshold of the individual memory component 112A has increased or decreased and is now a second temperature threshold. The media operations manager 122 can, in response, transition the individual memory component 112A from being associated with a first group of individual memory components 112A to 112N to a second group of individual memory components 112A to 112N which is associated with the second temperature threshold.

The media operations manager 200 can access the configuration data 220 to determine the temperature threshold associated with a first group of memory components 112A to 112N. The write temperature module 230 can access a write temperature associated with the data stored in the first group of memory components 112A to 112N. In some examples, the write temperature module 230 includes a thermometer for measuring a current temperature when data is being written to a respective group of memory components 112A to 112N. The write temperature module 230 can store the value obtained from the thermometer in association with the data written to the respective group of memory components 112A to 112N. The write temperature can be a current ambient temperature or a hardware temperature value of the respective group of memory components 112A to 112N. The media operations manager 200 determine that the write temperature associated with the first group of memory components 112A to 112N falls within a range of the temperature values associated with the temperature threshold stored in the configuration data 220. In response, the media operations manager 200 can communicate with the media operation selection 240 to access or retrieve a first type of memory management operations (e.g., a first media scan rate or frequency) corresponding to a write temperature that is greater than a maximum temperature threshold value or less than a minimum temperature threshold value. The media operations manager 122 can then perform the first type of memory management operation on the first group of memory components 112A to 112N. As another example, the media operations manager 200 determine that the write temperature associated with the first group of memory components 112A to 112N falls within the range of the temperature values associated with the temperature threshold stored in the configuration data 220. In response, the media operations manager 200 can communicate with the media operation selection 240 to access or retrieve a second type of memory management operations (e.g., a second media scan rate or frequency) corresponding to a write temperature that is between a maximum temperature threshold value and a minimum temperature threshold value.

The media operations manager 200 can access the configuration data 220 to determine a different type of temperature threshold associated with the first group of memory components 112A to 112N. The write temperature module 230 can access a write temperature associated with the data stored in the first group of memory components 112A to 112N. Namely, the write temperature module 230 can access a plurality of write temperatures associated with one or more word lines, pages, or blocks of data stored in the first group of memory components 112A to 112N. The write temperature module 230 can compute an average or mean or some other statistical representation of the plurality of write temperatures. The media operations manager 200 determine that the average or mean or some other statistical representation of the plurality of write temperatures associated with the first group of memory components 112A to 112N falls within a range of the temperature values associated with the temperature threshold stored in the configuration data 220. In response, the media operations manager 200 can communicate with the media operation selection 240 to access or retrieve a third type of memory management operations (e.g., a third media scan rate or frequency) corresponding to a write temperature that is greater than a maximum temperature threshold value or less than a minimum temperature threshold value. The media operations manager 122 can then perform the first type of memory management operation on the first group of memory components 112A to 112N. As another example, the media operations manager 200 determine that the average or mean or some other statistical representation of the plurality of write temperatures associated with the first group of memory components 112A to 112N falls within the range of the temperature values associated with the temperature threshold stored in the configuration data 220. In response, the media operations manager 200 can communicate with the media operation selection 240 to access or retrieve a fourth type of memory management operations (e.g., a fourth media scan rate or frequency) corresponding to a write temperature that is between a maximum temperature threshold value and a minimum temperature threshold value.

The media operations manager 200 can access the configuration data 220 to determine another type of temperature threshold associated with the first group of memory components 112A to 112N. The write temperature module 230 can access a write temperature associated with the data stored in the first group of memory components 112A to 112N. Namely, the write temperature module 230 can access a first write temperature associated with an initial or first portion of data, such as an initial or first word line, page, or block of data stored in the first group of memory components 112A to 112N and a second write temperature associated with a second or final portion of data, such as a second or final word line, page, or block of data stored in the first group of memory components 112A to 112N. The write temperature module 230 can compute a difference, deviation, or absolute value of a difference or deviation between the first and second write temperatures. The media operations manager 200 can determine that the difference, deviation, or absolute value of the difference or deviation between the first and second write temperatures transgresses or fails to correspond to the temperature threshold stored in the configuration data 220. In response, the media operations manager 200 can communicate with the media operation selection 240 to access or retrieve a fifth type of memory management operations (e.g., a fifth media scan rate or frequency or a folding operation). The media operations manager 122 can then perform the fifth type of memory management operation on the first group of memory components 112A to 112N. In some examples, the media operations manager 200 can determine that the difference, deviation, or absolute value of the difference or deviation between the first and second write temperatures transgresses or corresponds to the temperature threshold stored in the configuration data 220. In such examples, the media operations manager 200 can communicate with the media operation selection 240 to avoid performing a media management operation (e.g., prevent performing a folding operation) or to perform a sixth type of media management operation.

Figure 3:
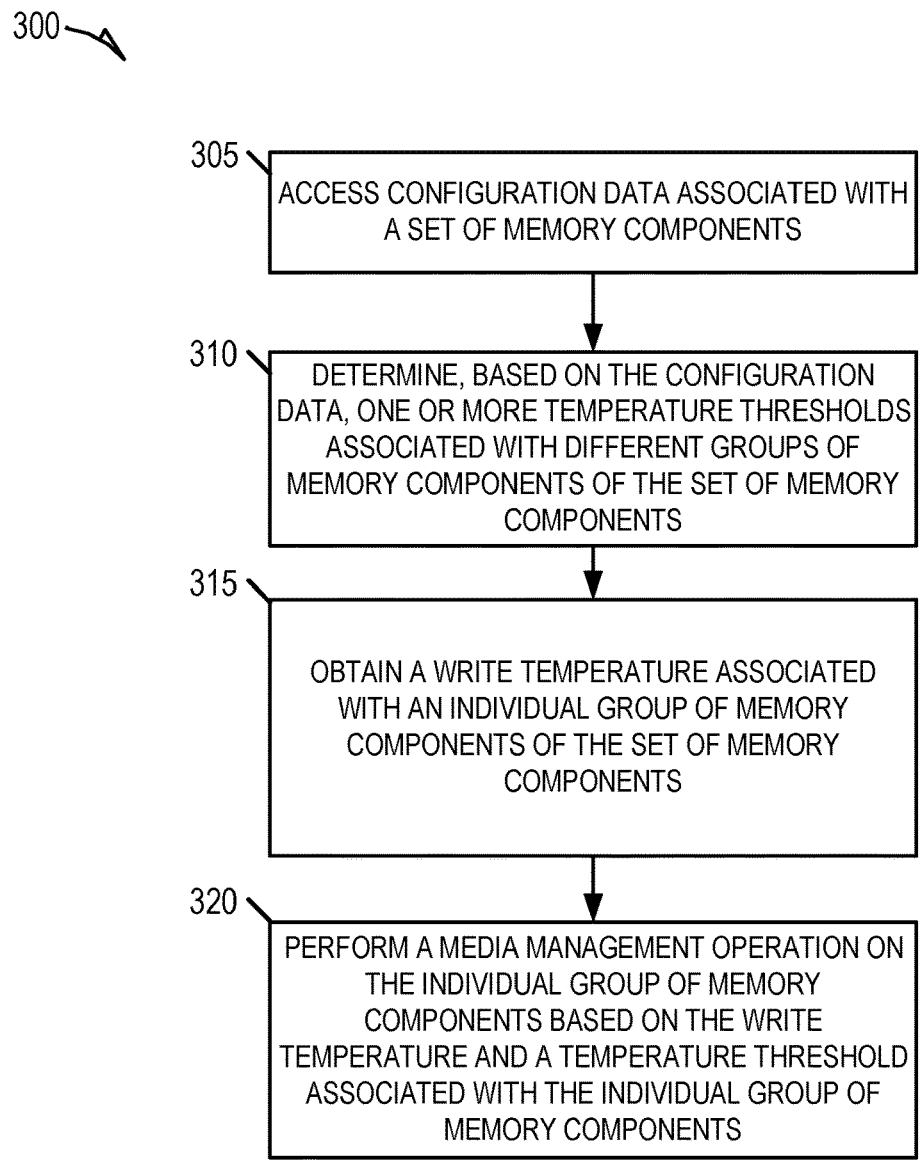
FIG. 3 is a flow diagram of an example method to selectively perform media management operations based on temperature thresholds, in accordance with some implementations of the present disclosure.

FIG. 3 is a flow diagram of an example method 300 to selectively perform media management operations based on reliability grades, in accordance with some implementations of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the media operations manager 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 3, the method (or process) 300 begins at operation 305, with a media operations manager 122 of a memory sub-system accessing configuration data, such as from a local storage register and/or from a processing device, such as the memory sub-system controller 115 (FIG. 1). For some embodiments, the configuration data is received from a host system (e.g., the host system 120) communicatively coupled to the memory sub-system.

At operation 310, the media operations manager 122 of the memory sub-system determines, based on the configuration data, one or more temperature thresholds associated with different groups of memory components of the set of memory components. Thereafter, at operation 315, the media operations manager 122 obtains a write temperature associated with an individual group of memory components of the set of memory components. Then, at operation 320, the media operations manager 122 performs a media management operation on the individual group of memory components based on the write temperature and a temperature threshold associated with the individual group of memory components.

Figure 4:
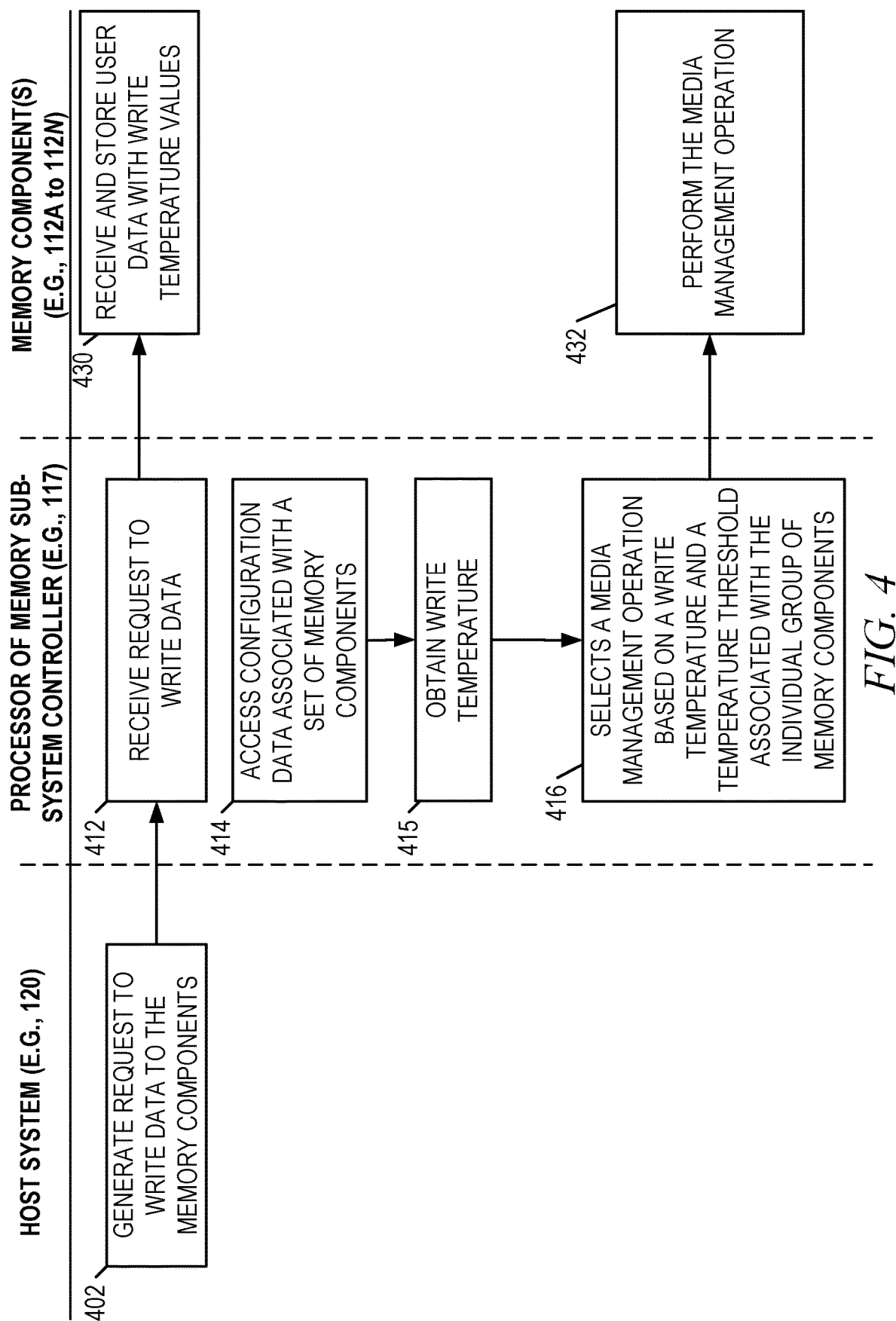
FIG. 4 provides an interaction diagram illustrating interactions between components of the computing environment in the context of some embodiments in which a media operations manager is used.

FIG. 4 provides an interaction diagram illustrating interactions between components of the computing environment 100 in the context of some embodiments. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by the memory sub-system controller 115 and/or by the media operations manager 122. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

In the context of the example illustrated in FIG. 4, the host system can comprise the host system 120, the processor of the memory sub-system controller can comprise the processor 117 of the memory sub-system 110, and the one or more memory components can comprise at least one of the memory components 112A to 112N.

As shown in FIG. 4, at operation 402, the host system (e.g., via a processor of the host system 120) generates a request to read/write data to the memory components and, at operation 412, the processor of the memory sub-system controller receives the request. The processor of the memory sub-system controller generates instructions to read/write the data to the memory components 112A to 112N. The memory components 112A to 112N receive the instructions and at operation 430, the memory components 112A to 112N receive and store the user data. Concurrently with writing or storing the user data, the processor of the memory sub-system controller can access or obtain a temperature measurement from a thermometer associated with the memory components 112A to 112N. The processor of the memory sub-system controller can store the obtained temperature measurement as the write temperature in association with the user data stored in the memory components 112A to 112N.

During startup, at runtime, continuously, and/or periodically, at operation 414, the processor of the memory sub-system controller accesses configuration data associated with the set of memory components 112A to 112N. The processor of the memory sub-system controller reads the configuration data to determine the temperature threshold(s) associated with different groups of the set of memory components 112A to 112N. Each group can be associated with a respective set of one or more temperature thresholds that are used to control different types of media management operations that are performed. The configuration data can also describe the type of memory (media) management operations to perform based on a comparison of the write temperature and the associated one of the temperature thresholds.

The processor of the memory sub-system controller can, at operation 415, access or obtain the previously stored write temperature or a plurality of write temperatures stored in association with one or more blocks, pages, word lines or cells. Using the configuration data, based on an individual one of the temperature thresholds of an individual group of the set of memory components 112A to 112N, at step 416, the processor of the memory sub-system controller selects a media management operation to perform from a plurality of media management operations by comparing a write temperature of one or more cells, pages, word lines and/or blocks of data stored in the individual group of the set of memory components 112A to 112N to the individual one of the temperature thresholds.

The processor of the memory sub-system controller generates instructions to perform the selected media management operation and provides those instructions to the set of memory components 112A to 112N. The set of memory components 112A to 112N, at operation 432, perform the media management operations corresponding to the instructions received from the processor of the memory sub-system controller.

Figure 5:
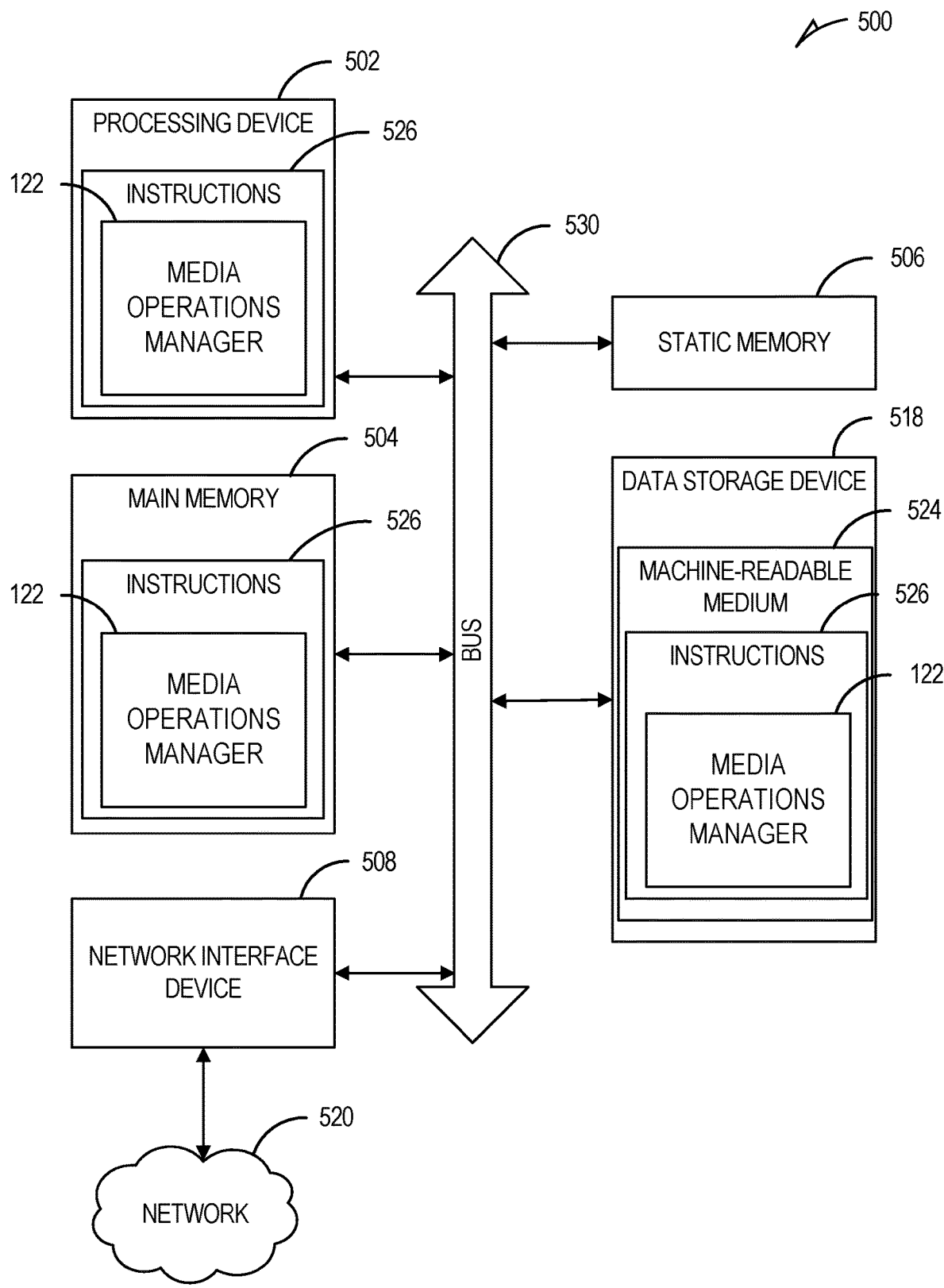
FIG. 5 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 implement functionality corresponding to the media operations manager 122 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the embodiments of the disclosure as set forth in the following claims. The specification and drawings are, accordingly, to be regarded in an illustrative sense rather than a restrictive sense.

What is claimed is:

1. A system comprising:
a set of memory components of a memory sub-system; and
at least one processing device operatively coupled to the set of memory components, the at least one processing device being configured to perform operations comprising:
obtaining a temperature associated with an individual group of memory components of the set of memory components;
comparing the temperature associated with the individual group of memory components to a temperature threshold associated with the individual group of memory components; and
performing an individual media management operation on the individual group of memory components based on a result of comparing the temperature associated with the individual group of memory components to the temperature threshold.

2. The system of claim 1, the operations comprising:
accessing configuration data associated with the set of memory components; and
determining, based on the configuration data, one or more temperature thresholds associated with different groups of memory components of the set of memory components.

3. The system of claim 2, wherein the configuration data comprises a table that associates the individual group of memory components with a first temperature threshold and associates another group of memory components with a second temperature threshold.

4. The system of claim 1, the operations comprising: selecting the individual media management operation from a plurality of media management operations based on a write temperature and the temperature threshold.

5. The system of claim 1, wherein the temperature threshold corresponds to a reliability measure defined by a difference between a read and write temperature of different groups of memory components.

6. The system of claim 1, wherein the individual media management operation comprises a media scan rate selected from a plurality of media scan rates.

7. The system of claim 1, wherein the individual media management operation comprises a folding operation that refreshes data stored in the individual group of memory components.

8. The system of claim 1, the operations comprising: determining that the individual group of memory components is associated with the temperature threshold; and computing a deviation between a write temperature and the temperature threshold.

9. The system of claim 8, the operations comprising: performing a first media management operation in response to determining that the deviation transgresses the temperature threshold; and performing a second media management operation in response to determining that the deviation is within the temperature threshold.

10. The system of claim 9, wherein the first media management operation comprises a first media scan frequency, and wherein the second media management operation comprises a second media scan frequency.

11. The system of claim 1, wherein the temperature threshold comprises a low temperature value and a high temperature value, the operations comprising: determining whether a write temperature is between the low temperature value and the high temperature value.

12. The system of claim 11, the operations comprising: performing a first media management operation in response to determining that the write temperature is between the low temperature value and the high temperature value.

13. The system of claim 12, the operations comprising: performing a second media management operation in response to determining that the write temperature is below the low temperature value or above the high temperature value.

14. The system of claim 1, the operations comprising performing a media scan operation comprising: accessing a first temperature value associated with a first word line of the individual group of memory components; accessing a second temperature value associated with a second word line of the individual group of memory components; and computing a difference between the first and second temperature values.

15. The system of claim 14, the operations comprising:

comparing the difference to the temperature threshold;

performing the individual media management operation in response to determining that the difference is greater than the temperature threshold; and preventing performance of the individual media management operation in response to determining that the difference is below the temperature threshold.

16. The system of claim 15, wherein the individual media management operation comprises a folding operation, and wherein the second word line is a last written word line of the individual group of memory components.

17. The system of claim 1, wherein the temperature threshold is a first temperature threshold, the operations comprising:

accessing a plurality of temperature thresholds associated with the individual group of memory components, the plurality of temperature thresholds comprising the first temperature threshold, wherein the first temperature threshold is associated with a first media management operation, and wherein a second of the plurality of temperature thresholds is associated with a second media management operation.

18. The system of claim 17, wherein the first temperature threshold is compared with a write temperature of the individual group of memory components, and wherein the second temperature threshold is compared with a difference between write temperatures of different word lines written to the individual group of memory components.

19. A method comprising:

obtaining a temperature associated with an individual group of memory components;

comparing the temperature associated with the individual group of memory components to a temperature threshold associated with the individual group of memory components; and performing an individual media management operation on the individual group of memory components based on a result of comparing the temperature associated with the individual group of memory components to the temperature threshold.

20. A non-transitory computer-readable storage medium comprising instructions that, when executed by at least one processing device, cause the at least one processing device to perform operations comprising:

obtaining a temperature associated with an individual group of memory components;

comparing the temperature associated with the individual group of memory components to a temperature threshold associated with the individual group of memory components; and performing an individual media management operation on the individual group of memory components based on a result of comparing the temperature associated with the individual group of memory components to the temperature threshold.

* * * * *